United States Patent
Sato et al.

(10) Patent No.: US 9,881,979 B2
(45) Date of Patent: Jan. 30, 2018

(54) FLEXIBLE DISPLAY DEVICE AND METHOD FOR MANUFACTURING THE SAME

(71) Applicant: Japan Display Inc., Tokyo (JP)

(72) Inventors: Toshihiro Sato, Tokyo (JP); Tohru Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/638,452

(22) Filed: Mar. 4, 2015

(65) Prior Publication Data

US 2015/0255522 A1 Sep. 10, 2015

(30) Foreign Application Priority Data

Mar. 5, 2014 (JP) ................ 2014-042677

(51) Int. Cl.
  *H01L 29/18* (2006.01)
  *H01L 27/32* (2006.01)
  (Continued)

(52) U.S. Cl.
  CPC .......... *H01L 27/3244* (2013.01); *H01L 25/18* (2013.01); *H01L 51/003* (2013.01);
  (Continued)

(58) Field of Classification Search
  CPC ............. H01L 27/1218; H01L 27/1225; H01L 27/1255; H01L 27/1266; H01L 27/124;
  (Continued)

(56) References Cited

U.S. PATENT DOCUMENTS

2010/0277448 A1* 11/2010 Okamoto .......... G02F 1/133305
  345/206
2013/0180653 A1    7/2013 Kim et al.
  (Continued)

FOREIGN PATENT DOCUMENTS

JP    2010-072380 A    4/2010
JP    2010-204377 A    9/2010
  (Continued)

OTHER PUBLICATIONS

Japanese Office Action dated Oct. 17, 2017 for corresponding JP Patent Application No. 2014-042677 with partial English Translation.

*Primary Examiner* — Hung Vu
(74) *Attorney, Agent, or Firm* — Typha IP LLC (57) ABSTRACT

How a flat panel display is bent by external forces is controlled. A display panel 40 has display elements, formed corresponding to the arrangement of pixels, on a first principal surface of a flexible display panel substrate 46. The display panel substrate 46 has a linear groove 48 on at least part of a second principal surface of the display panel substrate 46. A resin is stacked on a support substrate having a linear ridge on at least part of the surface of the support substrate. The surface shape of the support substrate is transferred to the resin so that the groove 48 is molded. Thus, the display panel substrate 46 made of the resin is formed on the support substrate. After the display elements are formed on the display panel substrate 46, the support substrate is removed from the display panel substrate 46.

5 Claims, 9 Drawing Sheets (51) Int. Cl.
*H01L 51/00* (2006.01)
*H01L 25/18* (2006.01)
*H01L 51/52* (2006.01)
*H01L 51/56* (2006.01)

(52) U.S. Cl.
CPC ...... H01L 51/0097 (2013.01); H01L 51/5253 (2013.01); H01L 51/56 (2013.01); *H01L 2227/323* (2013.01); *H01L 2227/326* (2013.01); *H01L 2251/301* (2013.01); *H01L 2251/5338* (2013.01); *H01L 2251/566* (2013.01); *Y02E 10/549* (2013.01); *Y02P 70/521* (2015.11)

(58) Field of Classification Search
CPC .. H01L 27/3244; H01L 51/0097; H01L 51/56
USPC .................................. 257/81, 84, 88, 96, 99
See application file for complete search history.

(56) References Cited

U.S. PATENT DOCUMENTS

2014/0183473 A1* 7/2014 Lee .................... H01L 51/0097
257/40
2015/0014644 A1* 1/2015 Namkung ........... H01L 51/0097
257/40

FOREIGN PATENT DOCUMENTS

| JP | 2010-282183 A | 12/2010 |
| JP | 2013-542460 A | 11/2013 |

* cited by examiner

FIG.12

FLEXIBLE DISPLAY DEVICE AND METHOD FOR MANUFACTURING THE SAME

CROSS-REFERENCE TO RELATED APPLICATION

The present application claims priority from Japanese application JP2014-042677 filed on Mar. 5, 2014, the content of which is hereby incorporated by reference into this application.

BACKGROUND OF THE INVENTION

1. Field of the Invention

The present invention relates to a display device and a method for manufacturing the display device. In particular, the invention relates to a flexible display.

2. Description of the Prior Art

Flat panel displays, such as an organic electroluminescence (EL) display device, have a display panel including a thin film transistor (TFT) or an organic light-emitting diode (OLED) on a substrate. Glass substrates have been used as the substrate of such display panels. On the other hand, flexible displays, which have a flexible display panel with a substrate including a resin film, have been developed in recent years.

SUMMARY OF THE INVENTION

A display panel that can freely bend according to external forces may degrade the viewability of its screen or be partially damaged by stress concentration.

To solve this problem, it is an object of the present invention to provide a well-controlled bend structure of a display panel and a method for manufacturing the display panel.

(1) A display device according to an aspect of the present invention includes an image display panel having display elements, formed corresponding to the arrangement of pixels, on a first principal surface of a flexible display panel substrate. The flexible display panel substrate has a linear groove on at least part of a second principal surface of the flexible display panel substrate.

(2) The display device according to the above (1) may further include an electronic circuit substrate connected to the image display panel. The electronic circuit substrate may be joined to a portion of the edge of the image display panel so that the portion does not intersect with the extension of the groove extending linearly.

(3) In the display device according to the above (1), the grooves may be filled with an elastic material with a lower elastic modulus than a material of the flexible display panel substrate.

(4) A method for manufacturing a display device according to another aspect of the present invention is a method for manufacturing the display device according to the above (1) to (3). A resin is stacked on a support substrate having a linear ridge on at least part of the surface of the support substrate. The surface shape of the support substrate is transferred to the resin so that the groove is molded. Thus, the display panel substrate made of the resin is formed on the support substrate. The display elements are formed on the display panel substrate stacked on the support substrate. After the display elements are formed, the support substrate is removed from the display panel substrate. The image display panel is thus manufactured.

(5) In the steps of forming the display panel substrate and forming the display elements in the method according to the above (4), a panel structure, including the display panel substrate and the display elements, may be integrally formed for a plurality of image display panels. The panel structure may be cut into the image display panels, and then the step of removing the support substrate may be performed.

DETAILED DESCRIPTION OF THE INVENTION

Embodiments of the present invention will now be described with reference to the accompanying drawings.

The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

A display device according to an embodiment of the present invention is an organic EL display device. The organic EL display device is an active matrix display devices, which is incorporated into televisions, personal computers, handheld devices, mobile phones, and other devices.

Figure 1:
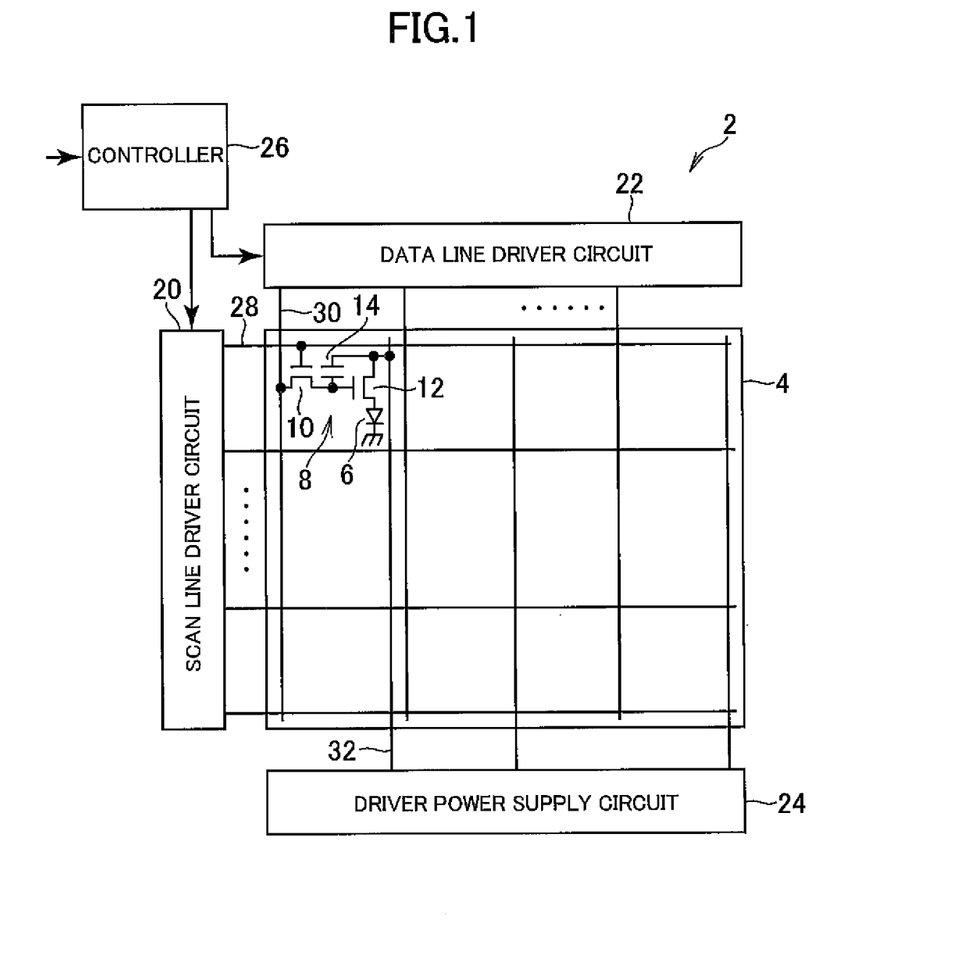
FIG. 1 is a schematic diagram showing a configuration of an organic EL display device according to an embodiment of the present invention.

FIG. 1 is a schematic diagram showing a configuration of an organic EL display device 2 according to the embodiment. The organic EL display device 2 includes a pixel array unit 4 that displays images and a driver that drives the pixel array unit 4. The organic EL display device 2 is a flat panel display including a display panel. The pixel array unit 4 is disposed in the display panel.

Display elements OLEDs 6 and pixel circuits 8, each corresponding to a pixel, are arranged in a matrix in the pixel array unit 4. Each pixel circuit 8 includes TFTs 10 and 12 and a capacitor 14.

The driver includes a scan line driver circuit 20, a data line driver circuit 22, a driver power supply circuit 24, and a controller 26. The driver drives the pixel circuits 8 to control the light emission of the OLEDs 6.

The driver may be formed together with the pixel circuits 8 in the display panel. Alternatively, the driver may be included in an integrated circuit (IC) that is manufactured separately from the pixel circuits 8, and the IC may be mounted in the display panel or on an FPC connected to the display panel.

The scan line driver circuit 20 is coupled to scan lines 28, each provided for the corresponding horizontal pixel alignment (pixel row). The scan line driver circuit 20 sequentially select the scan lines 28 in response to timing signals input from the controller 26, and applies, to each selected scan line, a voltage for turning on the corresponding lighting TFT 10.

The data line driver circuit 22 is coupled to data lines 30, each provided for the corresponding vertical pixel alignment (pixel column). The data line driver circuit 22 receives image signals from the controller 26. In synchronization with the selection of the scan line 28 by the scan line driver circuit 20, the data line driver circuit 22 outputs voltages, which depend on the image signal for the selected pixel row, to the corresponding data lines 30. In the selected pixel row, each of the voltages is written into the corresponding capacitor 14 via the lighting TFT 10. Each driver TFT 12 supplies a current, which depends on the corresponding written voltage, to the OLED 6, thus activating the OLEDs 6 in the pixels corresponding to the selected scan line 28 to emit light.

The driver power supply circuit 24 is coupled to drive power lines 32, each provided for the corresponding pixel column, and supplies a current to the OLEDs 6 via the drive power lines 32 and the driver TFTs 12 in the selected pixel row.

The anode of each OLED 6 is coupled to the corresponding driver TFT 12. The cathode of each OLED 6 is basically coupled to a ground potential. The cathodes of all the pixels belong to a common electrode.

Figure 2:
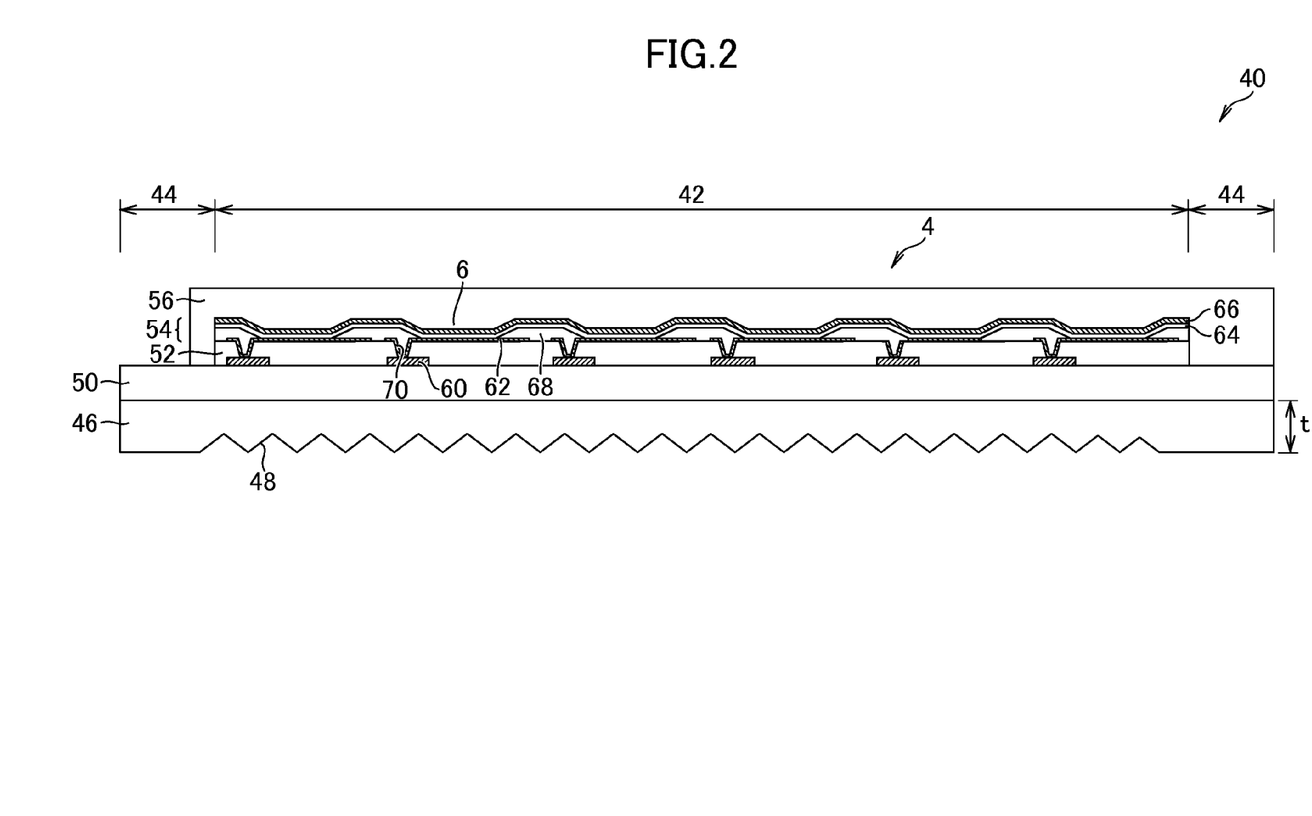
FIG. 2 is a schematic vertical cross-sectional view of a display panel of the organic EL display device according to the embodiment of the present invention.

FIG. 2 is a schematic vertical cross-sectional view of a display panel 40 and shows a display area 42 in which the pixel array unit 4 is arranged and peripheral areas 44 positioned outside the display area 42. The pixel array unit 4 in this embodiment is top emitting. The pixel array unit 4 includes the OLEDs 6, which are light-emitting elements, formed on a first principal surface, the upper side, of a display panel substrate 46. The pixel array unit 4 emits light generated by the OLEDs 6 in the direction opposite to the display panel substrate 46. That is, the light from the OLEDs 6 are emitted upward in FIG. 2, so that the upper side of the display panel 40 corresponds to an image display surface. On the other hand, the lower side the display panel 40 in FIG. 2 corresponds to the back of the display panel 40, and a second principal surface of the display panel substrate 46 is positioned near the back. As described below, the display panel substrate 46 has linear grooves 48 on at least part of the second principal surface.

The display panel substrate 46 is made of a flexible material, such as a resin. For example, the display panel substrate 46 may be made from polyimide, epoxy, acryl, polyethylene naphthalate, or a thermoplastic fluororesin such as tetrafluoroethylene-ethylene copolymer.

The pixel array unit 4 includes a circuit layer 50, an insulating layer 52, an OLED layer 54, and a cover layer 56, which are stacked on the display panel substrate 46.

Electronic circuits including the pixel circuits 8, the scan lines 28, the data lines 30, and the drive power lines 32, which are described above, are formed in the circuit layer 50. At least one of the scan line driver circuit 20, the data line driver circuit 22, the driver power supply circuit 24, and the controller 26 may be integrally formed with the pixel array unit 4 on the display panel substrate 46 as the circuit layer 50. The circuit layer 50 includes, for example, an underlayer for forming a polysilicon layer. The underlayer is made of an inorganic insulating material, such as silicon nitride (SiN) or silicon oxide (SiO) and is stacked on the display panel substrate 46. The polysilicon layer on the underlayer is used to form, for example, TFT channels. FIG. 2 shows source electrodes 60 of the driver TFTs 12, which are included in the electronic circuits formed in the circuit layer 50.

The insulating layer 52 is stacked on the circuit layer 50. The insulating layer electrically insulates the pixel circuits 8, each provided for the corresponding pixel, from each other, and also electrically insulates pixel electrodes 62 from the electronic circuits of the circuit layer 50. The insulating layer 52 is made, for example, of SiO or SiN.

The OLED layer 54 includes lower electrodes (pixel electrodes 62), an organic material stack layer 64, an upper electrode 66, and a bank 68.

The pixel electrodes 62, the upper electrode 66, and the organic material stack layer 64 sandwiched between these electrodes constitute the OLEDs 6. The upper electrode 66 is basically a common electrode that is evenly in contact with the organic material stack layer 64 of all the pixels in the display area. On the other hand, the pixel electrodes 62 are separated corresponding one-to-one to the pixels and are electrically coupled to the circuit layer (the source electrodes 60) through contact holes 70. In this embodiment, the upper electrode 66 is the cathode of the OLEDs 6, and the pixel electrodes 62 are the anodes of the OLEDs 6. The upper electrode 66 and the pixel electrodes 62 are made of a transparent conductive material, such as indium zinc oxide (IZO) or indium tin oxide (ITO). The organic material stack layer 64 includes a light-emitting layer to be described below. The light-emitting layer is injected with holes and electrons in accordance with a voltage applied between both electrodes, and emits light by the recombination of the holes and the electrons.

The bank 68 is formed of an insulating layer along the boundary between the pixels to electrically separate the pixel electrodes 62 from the upper electrode 66 along the boundary between the pixels.

The cover layer 56 is stacked on the OLED layer 54. The cover layer 56 has a sealing structure that is formed of a moisture-proof film and protects the OLEDs 6 from deterioration of properties due to moisture. The sealing structure has, for example, a stack of layers made of SiN.

When the display panel 40 uses a color filter method for colorization, the cover layer 56 includes color filters. In the color filter method, white light emitted by the OLEDs 6 passes through the color filters, thus forming pixels of various colors, such as red (R), green (G), and blue (B) light-emitting pixels. The color filters are made, for example, of a light transmissive resin material and are colored a plurality of colors, for example, with pigments. The color filters are made, for example, of color resists. White (W) pixels may also be provided without such color filters.

The cover layer 56 can further include a black matrix and an overcoat layer for protecting the surface of the display panel 40. The black matrix is arranged in the boundary area between the pixels. The black matrix is formed, for example, by patterning a light-blocking film made of metal, such as chromium (Cr), titanium (Ti), or tantalum (Ta). The overcoat layer is made of a transparent material. For example, the overcoat layer is formed of a transparent resin, such as an acrylic resin.

Figure 3A:
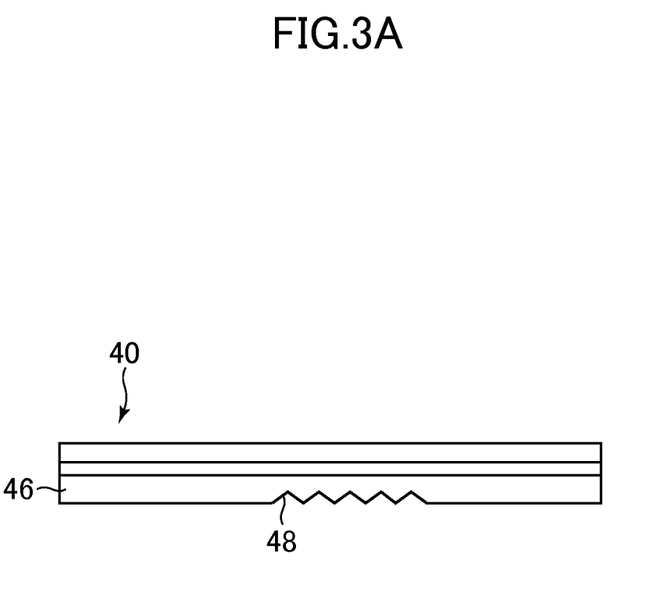
FIGS. 3A and 3B are schematic vertical cross-sectional views of the display panel, which focus on grooves formed on a display panel substrate.
Figure 3B:
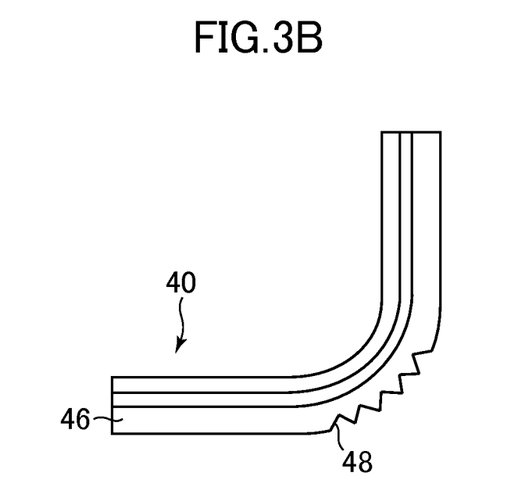

As described above, the second principal surface of the display panel substrate 46, which is the principal surface near the back of the display panel 40, has the linear grooves 48. FIGS. 3A and 3B are schematic vertical cross-sectional views of the display panel 40, which focus on the grooves 48. FIGS. 3A and 3B are schematic vertical cross-sectional views taken along the direction perpendicular to the grooves 48, so that the grooves 48 extend in the depth direction in the figures. FIG. 3A shows the display panel 40 on which no bending forces are acting, so that the display panel 40 shown in the figure remains flat. On the other hand, FIG. 3B shows the display panel 40 on which a force to lift the right edge of the panel is acting. The portion with the grooves 48 is more flexible in the direction perpendicular to the stripes (the extension of the grooves 48) than the other portion without the grooves 48. As shown in FIG. 3B, the portion with the grooves 48 can be bent with a greater curvature than the other portion without the grooves 48. Additionally, the flexibility of the portion with the grooves 48 changes depending on the angle between the bending direction and the direction of the stripes. The portion with the grooves 48 is more flexible in the direction perpendicular to the stripes than in the direction parallel to the stripes. That is, the position and the direction of the grooves 48 can determine a flexible portion and a flexible direction of the display panel 40.

For example, a flexible display has the advantage that it can be rolled or bent, but its flexibility may cause an unintended bending, which reduces visibility of display images, or induce stress concentration on a portion with low mechanical strength, which results in fragility of an IC or other components disposed on the portion. In this regard, the grooves 48 of the display panel 40 adjust a portion and a direction where the curvature is greater, thus preventing the reduction of visibility and damage in the display panel 40.

For example, both left and right edges of the display panel substrate 46, the peripheral areas 44 of the display panel 40 shown in FIG. 2, have a uniform thickness of t with no grooves 48 formed. On the other hand, the display area 42 of the display panel substrate 46, for example, has the plurality of grooves 48 arranged regularly and has a thickness less than t in the grooves 48. This configuration allows the peripheral areas 44 without the grooves 48 to be relatively less likely to be bent if held by a hand. This prevents the peripheral areas 44 from being bent with an unexpectedly large curvature by strong forces or uneven forces due to a hold, thus protecting the stack structure of the display panel 40 from damage. This also prevents an IC, constituting the driver, from being damaged if arranged on the peripheral area 44. On the other hand, the display area 42 with the grooves 48 is relatively flexible. This disperses forces to bend the display panel 40, generated by a hand holding the peripheral areas 44, along the direction perpendicular to the stripes of the grooves 48 in the display area 42. Consequently, this can prevent the display panel 40 from being damaged by stress concentration, and moderate the change in curvature in the display area 42 to improve visibility of display images.

When an electronic circuit substrate, such as an FPC, is connected to the display panel 40, the grooves 48 is preferably disposed so that the extension of the grooves 48 extending linearly does not pass through the joint between the display panel 40 and the electronic circuit substrate. On the other hand, when the position and the direction of the grooves 48 are determined to prevent the above reduction of visibility and the above damage in the display panel 40, the electronic circuit substrate is preferably joined to a portion of the edge of the display panel 40 so that the portion does not intersect with the extension of the grooves 48 extending linearly. Such determined positional relationship between the grooves 48 and the electronic circuit substrate can decrease the deformation of the joint of the electronic circuit substrate, thus preventing the electronic circuit substrate from separating or being damaged.

Figure 4:
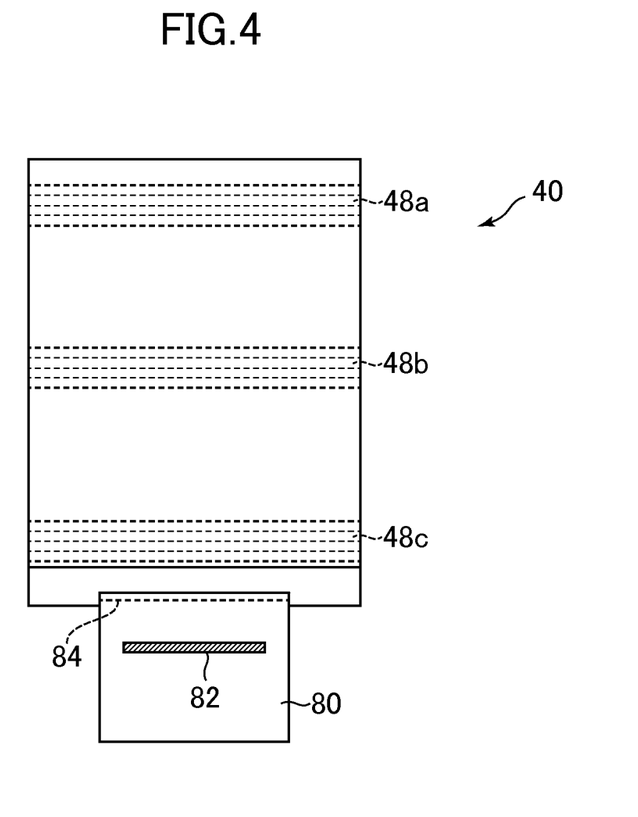
FIG. 4 is a schematic plan view of a display panel to which a flexible printed circuit (FPC) is connected.
Figure 5:
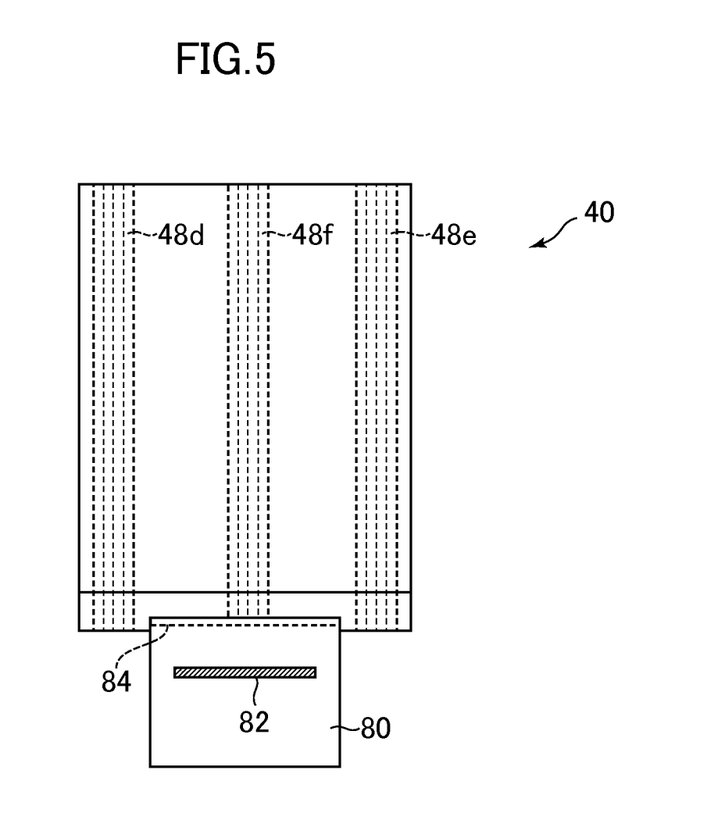
FIG. 5 is a schematic plan view of a display panel to which the FPC is connected.

FIGS. 4 and 5 are schematic plan views of the display panel 40 to which an FPC 80 is connected and illustrate positional relationships between the FPC 80 and the grooves 48. The FPC 80 is connected to the center of the bottom of the rectangular display panel 40. The FPC 80 has an IC 82 mounted on it, and the IC 82 extends in the direction along the bottom of the display panel 40.

In FIG. 4, grooves 48a to 48c extend horizontally, that is, in the direction parallel to the bottom of the display panel 40. The extensions of the grooves 48a to 48c do not pass through a joint 84 of the FPC 80. In FIG. 5, grooves 48d to 48f extend vertically, that is, in the direction perpendicular to the bottom of the display panel 40. Among them, the extension of the grooves 48d, positioned to the left of the display panel 40, and the extension of the grooves 48e, positioned to the right of the display panel 40, pass through portions in the bottom of the display panel 40 where the joint 84 is not positioned. On the other hand, the extension of the grooves 48f, positioned at the center of the display panel 40, pass through the joint 84. Thus, the grooves 48a to 48e are positionally preferable to the grooves 48f.

The vertical cross-sectional shape of the grooves 48 is not limited to a triangle shown in FIGS. 2 and 3. FIGS. 6 to 9 are schematic vertical cross-sectional views of the display panels 40, which illustrate cross-sectional shapes of the grooves 48. The display panels 40 shown in FIGS. 6 to 9 are rectangular like the display panels 40 shown in FIGS. 4 and 5. The FPC 80 with the IC 82 mounted on it is connected to one side of the circuit layer 50 of such display panels 40. FIGS. 6 to 9 show the cross sections taken along the direction perpendicular to the side to which the FPC 80 of the display panel 40 is connected. Each groove 48 shown in the figures expands in the direction parallel to the side like the grooves 48a to 48c.

Figure 6:
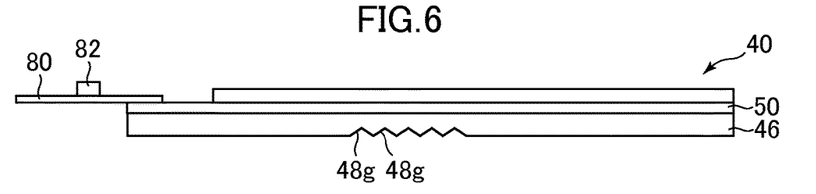
FIG. 6 is a schematic vertical cross-sectional view of a display panel, which illustrates across-sectional shape of grooves.
Figure 7:
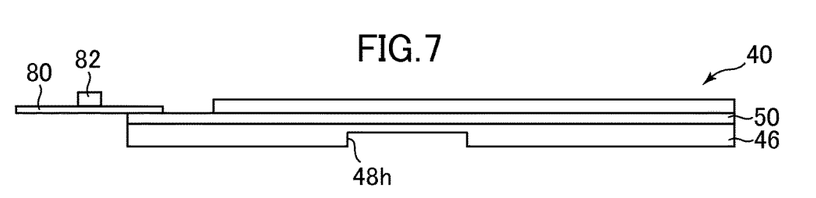
FIG. 7 is a schematic vertical cross-sectional view of a display panel, which illustrates across-sectional shape of a groove.
Figure 8:
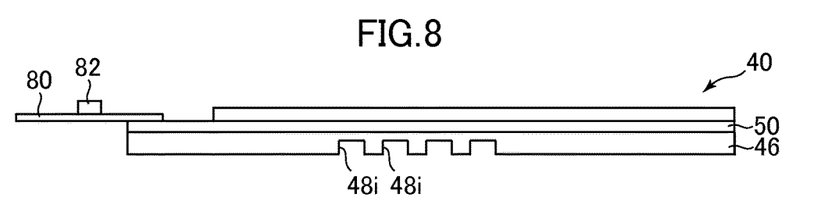
FIG. 8 is a schematic vertical cross-sectional view of a display panel, which illustrates across-sectional shape of grooves.
Figure 9:
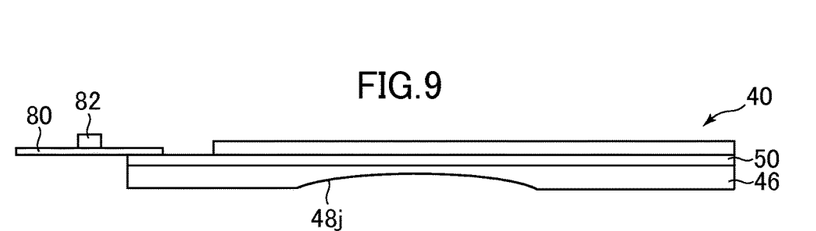
FIG. 9 is a schematic vertical cross-sectional view of a display panel, which illustrates across-sectional shape of a groove.

Each groove 48g shown in FIG. 6 has a triangular vertical cross-sectional shape described above. The vertical cross-sectional shape of the groove 48h shown in FIG. 7 is rectangular and, for example, is wider than that of the groove 48g. The vertical cross-sectional shape of each groove 48i shown in FIG. 8 is a rectangle narrower than that of the groove 48h shown in FIG. 7. The plurality of grooves 48i are arranged parallel to each other. The groove 48j shown in FIG. 9 has a wide and gently curved cross section.

Forming the grooves 48 to partially reduce the thickness of the display panel substrate 46 allows the display panel substrate 46 to be more flexible along the grooves 48. On the other hand, the display panel substrate 46 has the function of reinforcing the structure stacked on it to prevent the display panel 40 from being split or cracked. The shape of the grooves 48 and the thickness in the grooves 48 of the display panel substrate 46 are determined so as to achieve the function. For example, thinning the display panel substrate 46 by the grooves 48 allows the display panel 40 to be more flexible, but causes the display panel 40 to be more easily split or cracked, which is a trade-off relationship.

Here, filling the grooves 48 with an elastic material with a lower elastic modulus than the material of the display panel substrate 46 can strike a balance between the flexibility and the strength of the display panel substrate 46. For example, a resin material, such as polyethylene, polypropylene, polyvinyl chloride, polyvinylidene chloride, polystyrene, or poly vinyl acetate, may be used to fill the grooves 48 of the display panel substrate 46.

The following describes a method for manufacturing the organic EL display device 2. The method for manufacturing the organic EL display device 2 according to the embodiment of the present invention is characterized by a method of manufacturing the display panel 40. For example, a method for integrally forming the stack structure of a plurality of display panels 40 is described here.

Figure 10:
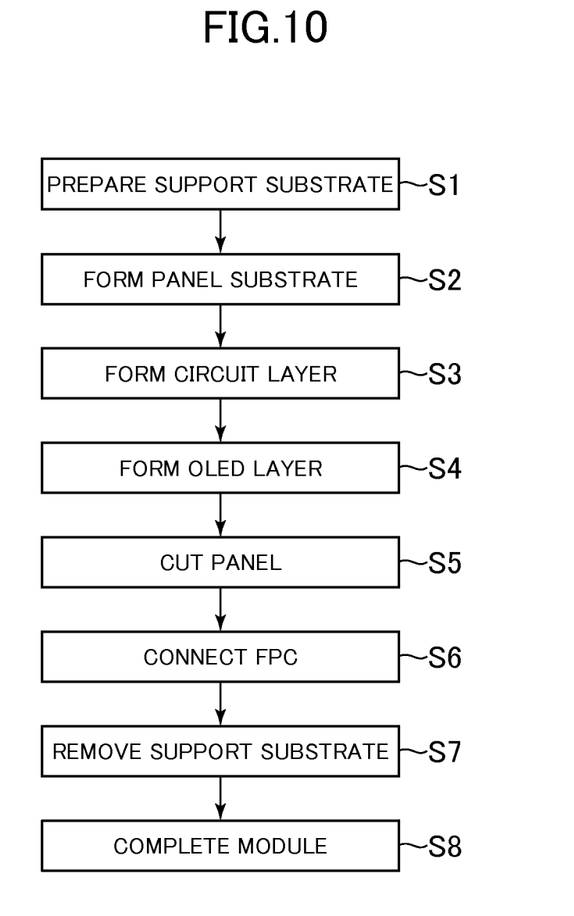
FIG. 10 is a process flowchart that outlines a method for manufacturing the display panel according to the embodiment of the present invention.
Figure 11:
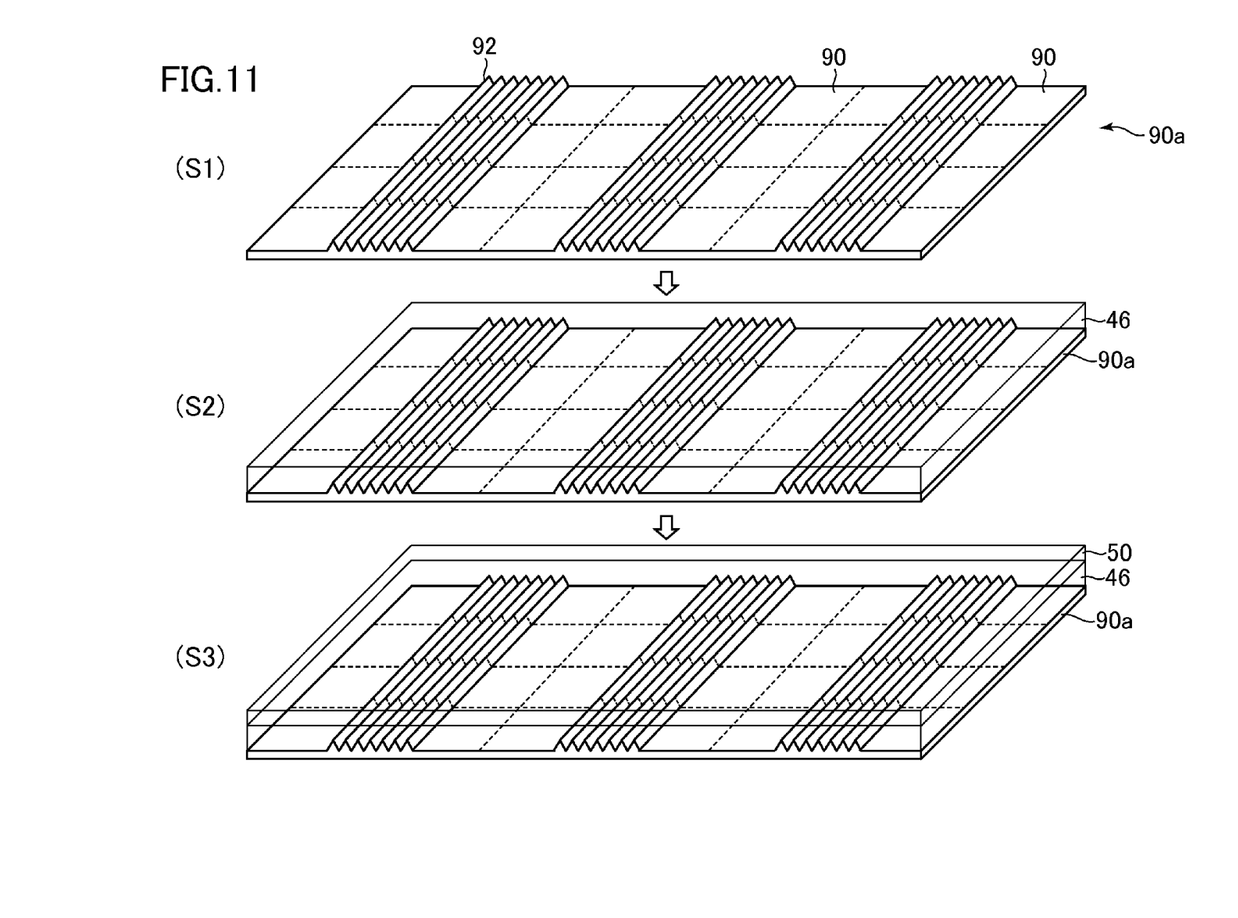
FIG. 11 includes schematic perspective views of the display panel corresponding to steps shown in FIG. 10.
Figure 12:
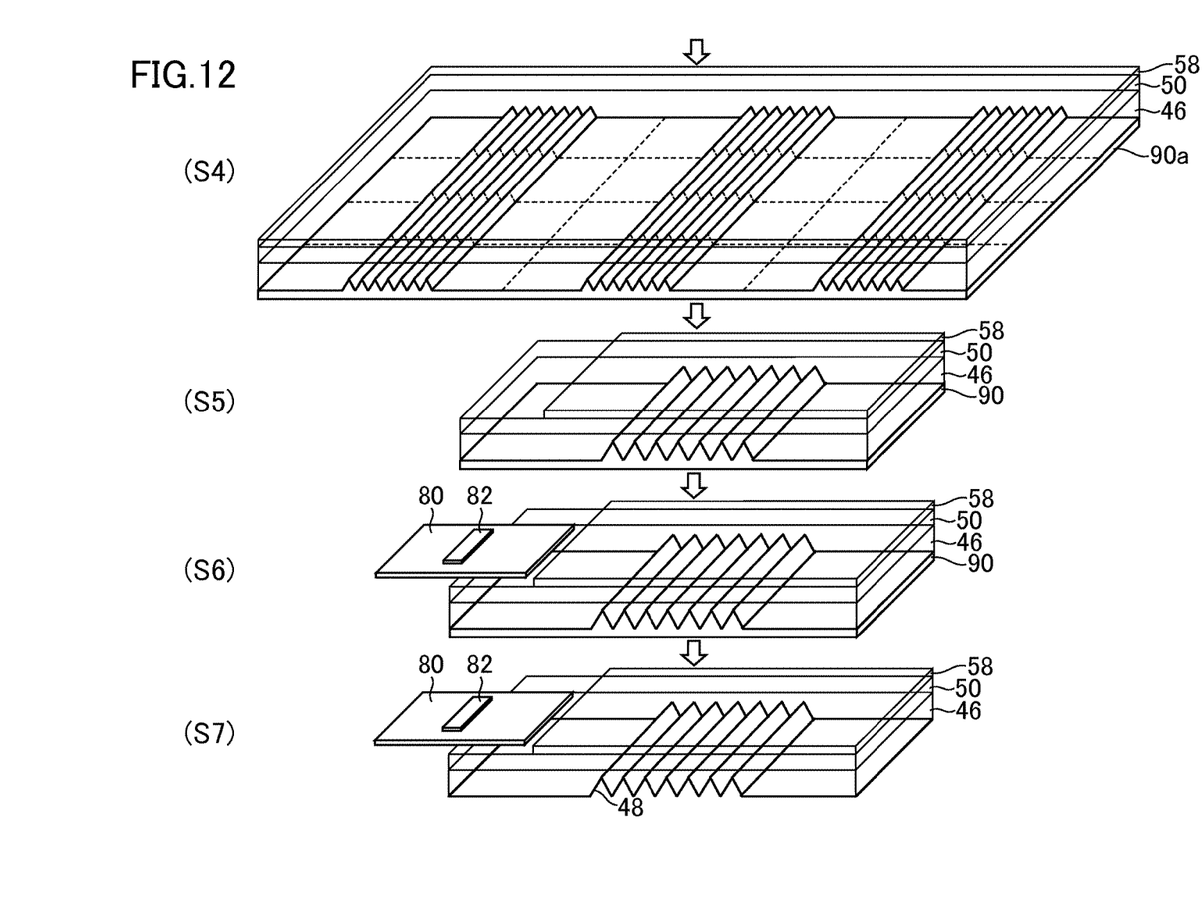
FIG. 12 includes schematic perspective views of the display panel corresponding to steps shown in FIG. 10.

FIG. 10 is a schematic process flowchart that outlines the manufacturing method. FIGS. 11 and 12 include schematic perspective views of the display panel 40 corresponding to steps shown in FIG. 10.

As the display panel substrate 46 is flexible, a support substrate 90 is prepared to keep the display panel substrate 46 flat in the manufacturing process of the display panel 40 (Step S1). The support substrate 90 is formed of a material, such as glass, quartz, silicon, silicon carbide (SiC), or nickel (Ni). The support substrate 90 has the function of supporting the display panel substrate 46 and functions as a mold to form the grooves 48 on the display panel substrate 46. Specifically, the support substrate 90 has linear ridges 92, formed corresponding to the grooves 48 of the display panel substrate 46, on at least part of the surface of the support substrate 90. To form the cross section of the each groove 48 into a triangular shape in the example described here, each ridge 92 also has the same triangular cross-sectional shape as the groove 48. To form the plurality of display panels 40 all together as described above, a single support substrate 90a, which is an integration of a plurality of support substrates 90, is prepared in this embodiment. The support substrate 90a has the same shape and size as the plurality of support substrates 90 arranged horizontally in a rectangular shape. For example, as shown in the step (S1) of FIG. 11, twelve support substrates 90, each corresponding to one display panel 40, arranged consecutively in a matrix with four rows and three columns are integrally formed into the single support substrate 90a.

A resin is stacked on the support substrate 90a, and the surface shape of support substrate 90a is transferred to the resin so that the grooves 48 are molded, thus forming the display panel substrate 46 made of the resin on the support substrate 90a (panel substrate forming step S2). For example, a solution of a resin is applied to the surface of the support substrate 90a by spin coating or other methods, and is resinified by heat treatment or other methods. Thus, the surface shape of the support substrates 90 is transferred to the resin, and the display panel substrate 46, having the grooves 48 on the back and a flat surface, is formed.

Alternatively, a film-shaped raw material may be placed on the support substrate 90a and be formed into the display panel substrate 46 by pressing or other methods. The film-shaped raw material may be a single sheet spreading throughout the support substrate 90a or a sheet having a size corresponding to one display panel 40 to be placed on each of the support substrates 90.

Then layers including the OLEDs 6 are formed on the display panel substrate 46 (display panel forming step). Specifically, the display panel forming step includes Step S3 of forming the circuit layer 50 on the surface of the display panel substrate 46 and Step S4 of forming an upper structure layer 58 including the insulating layer 52, the OLED layer 54, and the cover layer 56.

In the panel substrate forming step and the display panel forming step, a panel structure, including the display panel substrate 46 and the OLEDs 6, is integrally formed for the plurality of display panels 40, and then the panel structure is cut along the borders between the support substrates 90 to separate into the display panels 40 (cutting step S5).

After the cutting step, for example, part of the upper structure layer 58 on the circuit layer 50 is removed so that a connection terminal of the circuit layer 50 in the peripheral areas 44 of the display panel 40 is exposed upward through the upper structure layer 58. After a step of connecting the FPC 80 to the connection terminal (Step S6) and other steps, the support substrate 90 is removed from the back of the display panel substrate 46 (Step S7). Through such steps, a module of each display panel 40 is completed (Step S8).

Alternatively, the cutting step S5 may be performed after the support substrate 90a is removed from display panel substrate 46. In this case, the support substrate 90a can be reused.

As described above, the panel structure for the plurality of display panels 40 is formed, and then the panel structure is cut. Such a manufacturing method can improve the productivity of small to medium-sized display panels 40 by using an equipment capable of manufacturing large-sized display panels 40. On the other hand, as is the case for manufacturing large-sized display panels 40, a manufacturing equipment may not be able to manufacture the plurality of display panels 40 all together. In such a case, the display panel 40 is manufactured one by one, so that the cutting step is omitted.

In the above embodiment, an organic EL display device is shown as an example disclosure of the display panel. Other example applications for the display panel include liquid crystal display devices, other self-luminous display devices, electronic paper display devices having an electrophoretic device, quantum dot display devices, and any other flat panel display devices. It is needless to say that the present invention is not particularly limited to the above display devices but can also be applied to any display device ranging from small to medium-sized to large-sized display devices.

Various other variations and modifications can be conceived by those skilled in the art within the spirit of the present invention, and it will be understood that all such variations and modifications also fall within the scope of the invention. For example, those skilled in the art can appropriately modify the above embodiment by addition, deletion, or design change of components, or by addition, omission, or condition change of steps, and all such modifications also fall within the scope of the invention as long as they come within the spirit of the invention.

It will also be understood that other effects produced by an aspect of the embodiment, which are apparent from the description herein or can be appropriately conceived by those skilled in the art, are produced by the present invention as a matter of course.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   an image display panel having display elements on a first principal surface of a flexible display panel substrate, the display elements being formed corresponding to an arrangement of pixels; and
   an electronic circuit substrate connected to the image display panel,
   wherein the flexible display panel substrate has a first linear groove and a second linear groove on a second principal surface of the flexible display panel substrate,
   wherein the image display panel has a display area, in which the pixels are arranged, and peripheral areas positioned outside of the display area and provided at both edges of the flexible display panel substrate, the display area having the first and second linear grooves,
   wherein the peripheral areas extend in a direction perpendicular to an extending direction of the first and second linear grooves,
   wherein the electronic circuit substrate is connected to a portion in the peripheral area of one of the edges of the image display panel so that the portion does not intersect with an extension of the first and second linear grooves extending linearly, and
   wherein the first linear groove, the portion, and the second linear groove are arranged in this order in the one edge of the image display panel.

2. The display device according to claim 1, wherein the first and the second linear grooves are filled with an elastic material with a lower elastic modulus than a material of the flexible display panel substrate.

3. The display device according to claim 1, wherein a shape of each of the first and the second linear grooves is a rectangular shape in cross sectional view.

4. The display device according to claim 1, wherein a shape of each of the first and the second linear grooves is a triangle shape in cross sectional view.

5. The display device according to claim 1, wherein a shape of each of the first and the second linear grooves is an arc shape in cross sectional view.

* * * * *